(12) United States Patent
Neuman et al.

(10) Patent No.: US 9,565,752 B1
(45) Date of Patent: Feb. 7, 2017

(54) WIRE BONDED ELECTRONIC DEVICES TO ROUND WIRE

(71) Applicant: AUTOMATED ASSEMBLY CORPORATION, Lakeville, MN (US)

(72) Inventors: Robert Neuman, Cannon Falls, MN (US); Scott Lindblad, Lakeville, MN (US)

(73) Assignee: Automated Assembly Corporation, Lakeville, MN (US)

( * ) Notice: Subject to any disclaimer, the term of this patent is extended or adjusted under 35 U.S.C. 154(b) by 46 days.

(21) Appl. No.: 14/737,268

(22) Filed: Jun. 11, 2015

(51) Int. Cl.
| | | |
|---|---|---|
| *H01Q 1/00* | (2006.01) | |
| *H05K 1/02* | (2006.01) | |
| *H01Q 1/50* | (2006.01) | |
| *F21V 23/00* | (2015.01) | |
| *H05K 1/03* | (2006.01) | |
| *H05K 1/09* | (2006.01) | |
| *F21K 99/00* | (2016.01) | |
| *H05K 3/10* | (2006.01) | |
| *H05K 3/32* | (2006.01) | |
| *F21Y 101/02* | (2006.01) | |

(52) U.S. Cl.
CPC .............. *H05K 1/028* (2013.01); *F21K 9/90* (2013.01); *F21V 23/002* (2013.01); *H01Q 1/50* (2013.01); *H05K 1/032* (2013.01); *H05K 1/0386* (2013.01); *H05K 1/0393* (2013.01); *H05K 1/09* (2013.01); *H05K 3/103* (2013.01); *H05K 3/32* (2013.01); *F21Y 2101/02* (2013.01); *H05K 2201/0145* (2013.01); *H05K 2201/0158* (2013.01); *H05K 2201/10098* (2013.01); *H05K 2201/10106* (2013.01)

(58) Field of Classification Search
CPC .................................. H05K 1/028; H05K 1/32
USPC .. 343/905, 711, 788, 702; 235/492; 257/776
See application file for complete search history.

(56) References Cited

U.S. PATENT DOCUMENTS

| | | | |
|---|---|---|---|
| 7,629,694 B2* | 12/2009 | Mouttet | G11C 5/05 257/776 |
| 2004/0061660 A1* | 4/2004 | Yoshida | G07C 9/00309 343/788 |
| 2014/0061314 A1* | 3/2014 | Chan | G06K 19/07779 235/492 |

* cited by examiner

*Primary Examiner* — Peguy Jean Pierre
(74) *Attorney, Agent, or Firm* — Crawford Maunu PLLC (57) ABSTRACT

A disclosed circuit arrangement includes a substrate, an integrated circuit (IC) component attached to the substrate, first and second cross wires attached to the substrate and disposed proximate the electronic device, and one or more wire segments attached to the substrate. The one or more wire segments have first and second portions attached at a third portion of the first cross wire and at a fourth portion of the second cross wire, respectively. The first and second cross wires and the one or more wire segments are round wires having round cross sections. The first portion and the third portion have flat areas of contact, and the second and fourth portions have flat areas of contact. A first bond wire is connected to the electronic device and to the first portion of the one or more wire segments, and a second bond wire is connected to the electronic device and to the second portion of the one or more wire segments.

23 Claims, 5 Drawing Sheets

WIRE BONDED ELECTRONIC DEVICES TO ROUND WIRE

FIELD OF THE INVENTION

The disclosure describes wire bonding electronic devices to round wiring on a substrate.

BACKGROUND

There are a number of applications in which electronics are attached to various articles. The electronics may provide a function that is ancillary to the function of the article or may work in conjunction with the article to provide a desired function. Radio frequency identification (RFID), near-field communication, and light-emitting diode (LED) lighting are examples of such applications.

RFID applications vary from inventory control to traffic management to pet identification. RFID systems generally include readers and tags. RFID tags are affixed to the articles to be tracked, and the RFID reader emits a signal to activate the RFID tag. The RFID tag may respond by reading data from a memory and emitting a signal with the desired information for the RFID reader. Near-field communication tags are expanding RF applications beyond identification to data gathering applications.

LED-based lighting is becoming more popular due in part to the energy efficient qualities and durability of LEDs. Applications for LED-based lighting may include advertising signage, decorations, or utility and general purpose lighting.

For some applications, LEDs or RFID integrated circuits (ICs) and associated wiring are mounted on a flexible substrate. Prior to mounting the electronic device, wiring patterns may be formed on the substrate using a print-and-etch process. The wiring patterns are laid out to accommodate placement of one or more devices on the substrate at desired locations.

Making RFID tags or LED arrangements on a flexible substrate may be prohibitively expensive for some applications. The expense is attributable in part to the print-and-etch processes used in creating the wiring pattern. Expensive chemicals are required for print-and-etch processes, and hazardous waste is a byproduct.

SUMMARY

The above summary is not intended to describe each disclosed embodiment. The figures and detailed description that follow provide additional example embodiments.

A circuit arrangement is provided in one embodiment, The circuit arrangement includes a substrate, an integrated circuit (IC) component attached to the substrate, first and second cross wires attached to the substrate and disposed proximate the electronic device, and one or more wire segments attached to the substrate. The one or more wire segments have first and second portions attached at a third portion of the first cross wire and at a fourth portion of the second cross wire, respectively. The first and second cross wires and the one or more wire segments are round wires having round cross sections. The first portion and the third portion have flat areas of contact, and the second and fourth portions have flat areas of contact. A first bond wire is connected to the electronic device and to the first portion of the one or more wire segments, and a second bond wire is connected to the electronic device and to the second portion of the one or more wire segments.

A method of making a circuit arrangement is provided in another embodiment. The method includes attaching first and second cross wires and one or more wire segments to a substrate. The first and second cross wires and one or more wire segments have round cross sections, and the one or more wire segments have first and second portions that intersect the first and second cross wires, respectively. The method compresses the first and second portions of the one or more wire segments and portions of the cross wires at the intersections with the first and second portions of the one or more wire segments. An integrated circuit (IC) component is attached to the substrate proximate the first and second cross wires, and the compressed portions of the first and second portions of the one or more wire segments and portions of the cross wires are wire bonded to the electronic device.

BRIEF DESCRIPTION OF THE DRAWINGS

Other aspects and advantages will become apparent upon review of the Detailed Description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed structures and methods simplify attachment of wiring to electronic devices such as RF transponders, LEDs, and discrete components, such as capacitors and resistors. In addition, RF transponder arrangements and LED-based lighting apparatus may be constructed with low-cost materials and processes, with fewer environmentally hazardous chemicals used in manufacturing.

Some makers of RF transponder arrangements and LED-based lighting apparatus use round wire rather than printed-and-etched patterns of conductive material for wiring the electronic devices. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire to make antennas or provide power to LEDs eliminates the use of environmentally hazardous chemicals as would be required for printing and etching. However, additional challenges are presented in connecting the wire to electronic devices such as RF transponders, LEDs, or discrete components. Electronic devices as used herein refers to integrated circuit (IC) components as well as to discrete components such as capacitors, resistors, etc.

Automated wire bonding machines may be used to construct wire bonds between the antenna and/or power wiring and the electronic device. With fine gauge wire as the antenna/power wire, the wire bonding machine may have difficulty locating the desired portions of the wiring. Distinguishing a strand of the fine gauge wire from the adhesive that binds the antenna wire to the substrate based on imagery gathered by the wire bonding machine may be problematic. In addition, even if the wire bonding machine is properly positioned, making a durable wire bond on the fine gauge wire presents problems. The fine gauge and rounded surface of the wire make an unstable bonding surface and are not conducive to making a strong joint between the wire and bond wire.

In one implementation, a circuit arrangement includes a substrate and an electronic device attached to the substrate. Cross wires are also attached to the substrate and disposed proximate the electronic device, such that the electronic device may be wire bonded at the cross wires. One or more segments of wire are attached to the substrate, with a first portion intersecting one of the cross wires and a second portion intersecting another one of the cross wires. The cross wires and one or more wire segments are round wires, but have flat areas of contact formed at the intersections between the cross wires and the one or more wire segments. Bond wires connect the electronic device to the joints at the intersections between the cross wires and the one or more wire segments.

In a method of making a circuit arrangement, first and second round cross wires along with one or more round wire segments are attached to a substrate. The first and second cross wires intersect the one or more wire segments. The portions of the one or more wire segments and portions of the cross wires at the intersections are compressed, forming flat contact areas. The compressed joints at the intersections of the cross wires and wire segments provide stable areas for welding and wire bonding. In addition, the intersections may be readily detected by camera-guided welding and wire bonding machines. An electronic device is attached to the substrate proximate the first and second cross wires and wire bonded to the flat contact areas of the first and second portions of the one or more wire segments.

Figure 1:
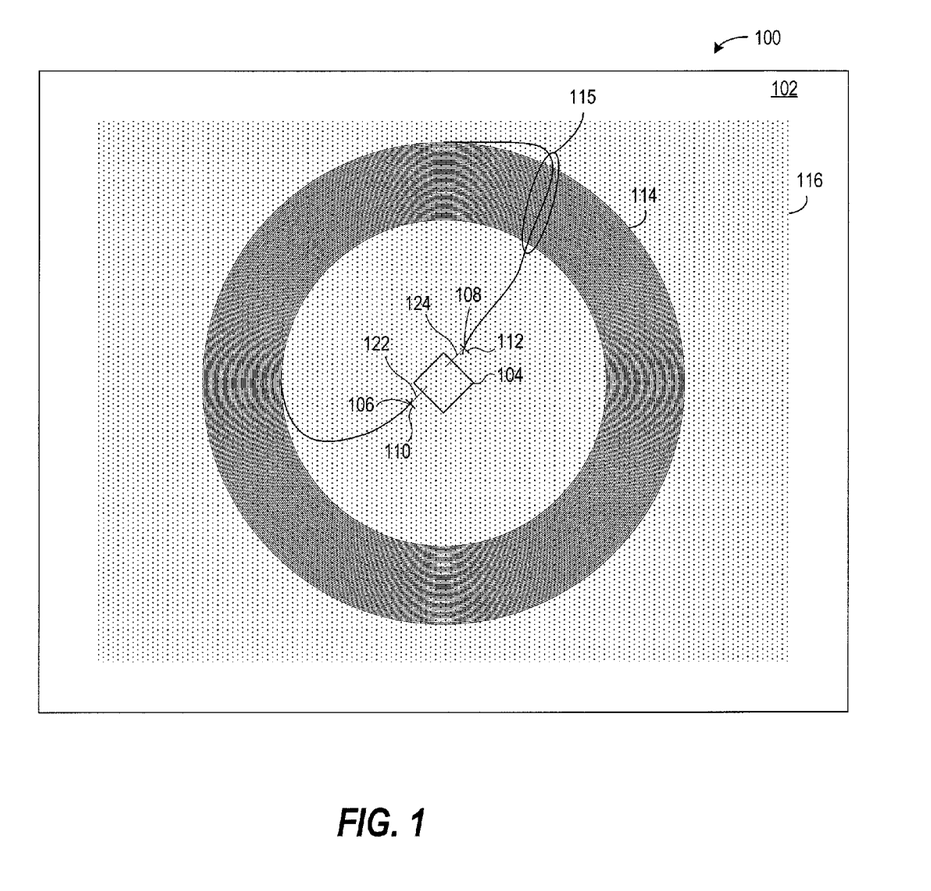
FIG. 1 shows an example of an RF transponder arrangement.

FIG. 1 shows an example of an RF transponder arrangement 100. The RF transponder arrangement includes a substrate 102, an RF transponder 104, and coil antenna wire 114. The particular functions of the RF transponder are application dependent. Example applications include RFID and near-field communications. In general, the transponder modulates and demodulates an RF signal and processes information according to the application. The RF transponder may be packaged or unpackaged (a "bare die") according to application requirements. The substrate may be either rigid or flexible, also depending on application requirements. In one implementation, the substrate is a flexible substrate and is one of a polyethylene terephthalate (PET), a polyelectrolyte multilayers (PEMs), paper, a high-density polyethylene, or a vinyl, for example.

Rather than using expensive print-and-etch techniques to make antenna wiring for the RF transponder, wire may be glued to the substrate. The wire may be bare wire or wire encased in a dielectric jacket. The wire may be made of any material suitable for the application. The antenna wire 114 may be a fine gauge, round (round cross-section), bare wire. For example, 44 gauge (AWG) copper or silver-coated copper wire has been found to be suitable for some applications. However, different gauges may be suitable for different applications. For an implementation having bare antenna wire, an insulating bridge (not shown) may be disposed between intersecting portions 115 of the antenna wire.

The wire is glued to the surface of the substrate with a polymer adhesive 116. The adhesive may be pressure sensitive, which keeps the wire in place as the antenna pattern is formed on the substrate. It will be appreciated that other types of adhesives may be suitable for different applications. The RF transponder 104 may be attached to the substrate 102 using the same adhesive as is used for the antenna wire. In an example implementation, the wire and transponder may be applied to adhesive as carried on adhesive transfer tape.

Cross wires 110 and 112 are attached to the substrate by the adhesive 116 and located proximate the RF transponder 104, in particular, at a distance suitable for wire bonding of the RF transponder to the end portions of the antenna wire. The cross wires may be segments of round copper, silver-coated copper, aluminum, or stainless steel wire, bare or jacketed, of the same diameter or larger diameter than the antenna wire, and are attached to the substrate by the adhesive and disposed proximate the RF transponder. Antenna wire 114, which is a single coiled wire segment in the example, has portions for connecting to bond wires 122 and 124. In the coil antenna pattern, connections to the RF transponder are made at end portions 106 and 108 of the antenna wire. For other antenna patterns, the connection to the RF transponder may be at portions between the end portions of the antenna wire (e.g., FIG. 5). End portions 106 and 108 of the antenna wire intersect the cross wires, and the wires at the intersections are compressed together to form a flat contact area for wire bonding the antenna to the RF transponder.

Figure 2:
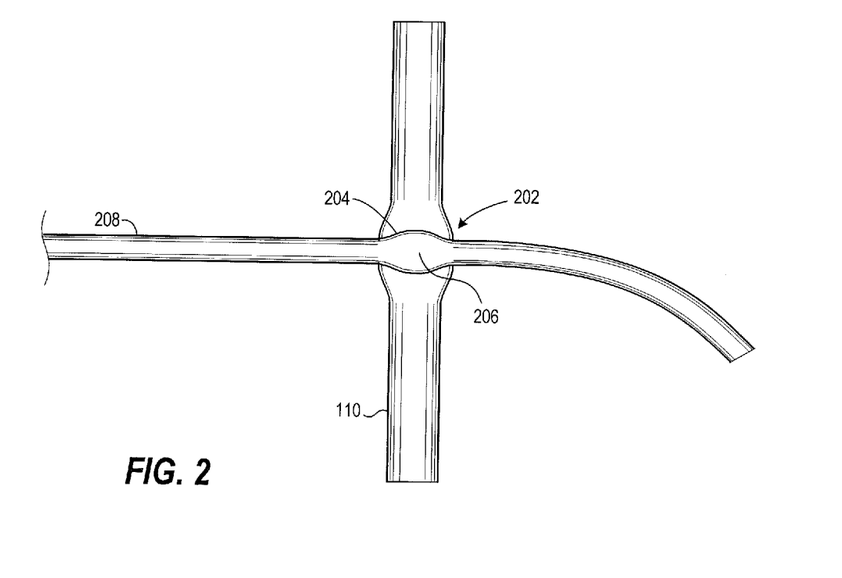
FIG. 2 shows a plan view of the intersection between a cross wire and a portion of round wire.

FIG. 2 shows a plan view of the intersection 202 between a cross wire 110 and a portion 204 of round wire 208. The portion 204 of the round wire may correspond to either of portions 106 and 108 of the antenna wire of FIG. 1. In alternative applications, the portion 204 may correspond to a portion of the antenna wire of FIG. 5 or a portion of the power or control wires for an LED as in FIG. 6.

The cross wire 110 and wire 208 are compressed at the intersection 202, forming a flat contact area 206 for wire bonding. In addition to forming a contact area for wire bonding, compression of the intersection mechanically interlocks the cross wire 110 and portion 204 at the intersection, thereby stabilizing the joint for welding. The intersection further provides a marker for camera-guided welding and wire bonding equipment.

Figure 3:
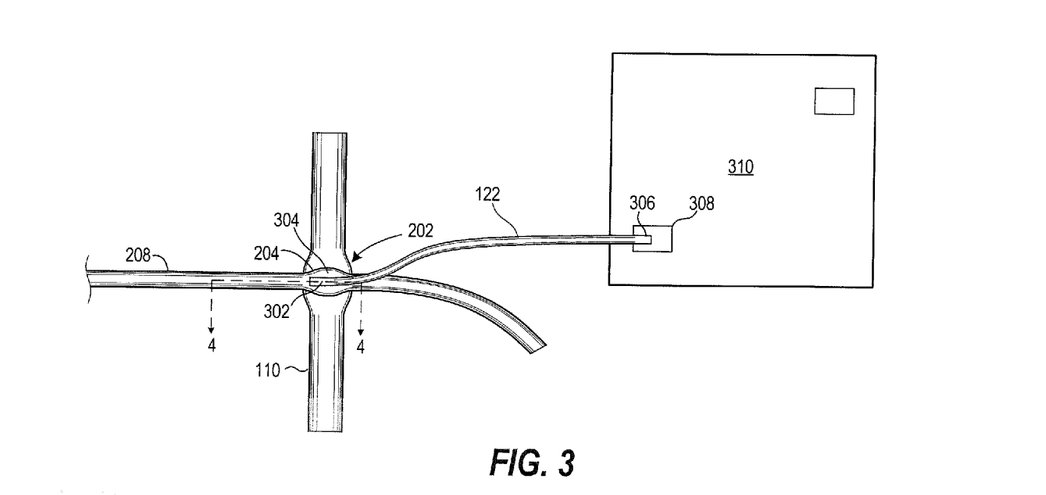
FIG. 3 shows a plan view of the cross wire and a portion of round wire, along with an electronic device and bond wire connecting the electronic device to the wire at the cross wire joint.

FIG. 3 shows a plan view of the cross wire 110 and a portion 204 of round wire 208, along with an electronic device 310 and bond wire 122 connecting the electronic device to the wire 208 at the cross wire joint. Once the cross wire 110 and portion 204 have been welded at the intersection 202, the bond wire 122 may be attached to the flat contact area at the resulting joint.

One end 302 of the bond wire 122 is bonded to flat contact area 304, and the other end of the bond wire 306 is bonded to the contact pad 308 on the electronic device 310. The bond wire may be wedge bonded to the RF transponder and antenna wire to provide a low profile. In other applications, the bond wires may be ball bonded. In an example implementation, the cross wire 110 and wire 208 may be copper, silver coated copper, aluminum, or stainless steel wire, and the bond wire may be either gold or aluminum.

Figure 4:
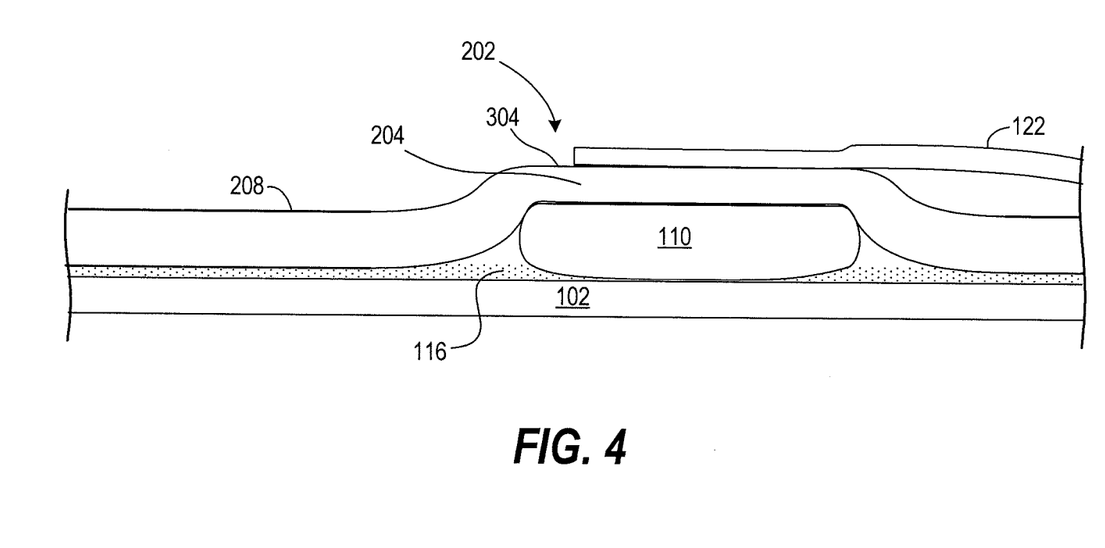
FIG. 4 shows a cross sectional view, taken in the direction of arrow 4 in FIG. 3, of the joint at which the cross wire, wire, and bond wire are connected.

FIG. 4 shows a cross sectional view, taken in the direction of arrow 4 in FIG. 3, of the joint at which the cross wire 110, wire 208, and bond wire 122 are connected. The view shows the flat contact area 304 and the interlocking of the cross wire 110 and the portion 204 of the wire 208 formed as a result of compressing the joint 202. The cross wire 110 and portion 204 of the wire 208 are not round at the compressed joint, as shown by the cross section of the cross wire 110. After the cross wire and the wire segment have been welded at the joint, the bond wire 122 may be attached to the flat contact area 304 such as by wedge bonding or ball bonding.

In one embodiment, the cross wire 110, wire 208, and bond wire 122 may be of different sizes. For example, the cross wire may be of a larger gauge than the wire segment, and the wire segment may be of a larger gauge than the bond wire. In other implementations, the cross wire and wire segment may be of the same gauge, and the bond wire of a smaller gauge.

Figure 5:
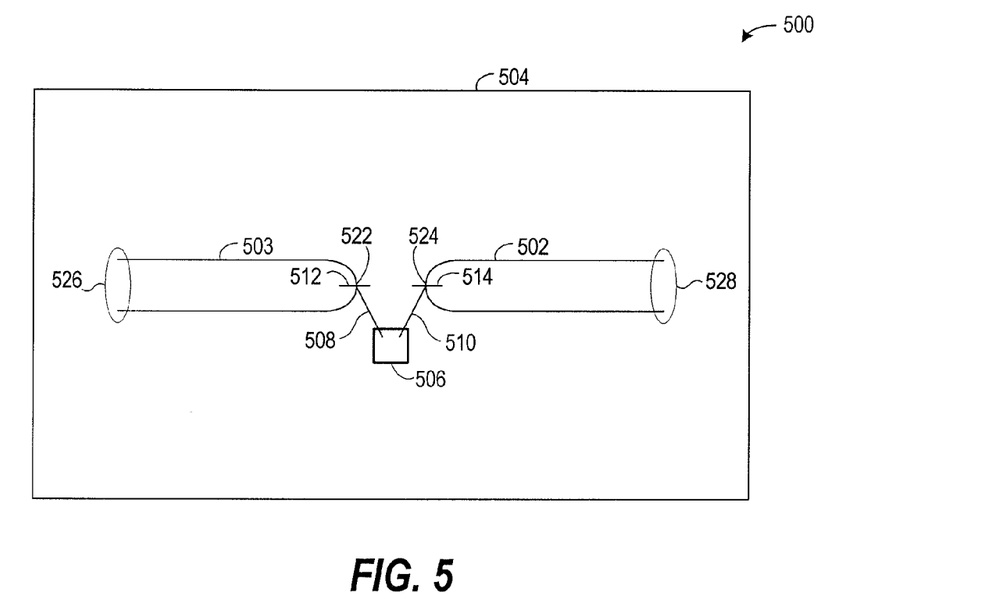
FIG. 5 shows an alternative antenna pattern and the connection of the antenna wires to the cross wires.

FIG. 5 shows an alternative antenna pattern and the connection of the antenna wires to the cross wires. The antenna pattern includes wire segments 502 and 503 and having the wire bonds at portions of the antenna wire that are between end portions of the antenna wire. It will be appreciated that in addition to the antenna patterns of FIGS. 1 and 5, the disclosed structures are adaptable for any of the many different antenna patterns known in the art to be suitable for RF transponder applications. As with the RF transponder arrangement 100 of FIG. 1, RF transponder arrangement 500 includes a substrate 504 and an RF transponder 506. The antenna and RF transponder may be adhered to the substrate as described for the RF transponder arrangement 100.

Cross wires 512 and 514 are attached to the substrate 504 and located proximate the RF transponder 506. The wire segments 502 and 503 intersect the cross wires 512 and 514, respectively, and the intersections are at portions 522 and 524 of the wire segments that are between the end portions 526 and 528. The wires at the intersections are compressed as described above. The bond wires 508 and 510 connect the RF transponder 506 to flat contact areas (e.g., FIGS. 2, 3) at portions 522 and 524 of the wire segments 502 and 503. The type of wire used for the wire segments 502 and 503 may be the same as the type of wire used for the antenna wire 114 of FIG. 1.

Figure 6:
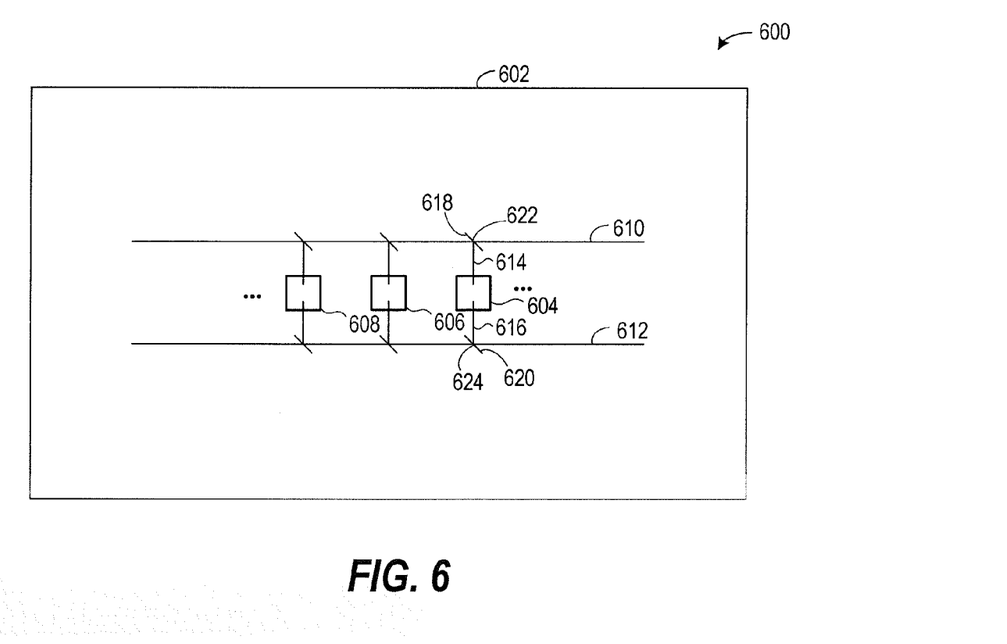
FIG. 6 shows an LED-based lighting arrangement having wire bonds from the LEDs to joints formed at the intersections of cross wires and power wires.

FIG. 6 shows an LED-based lighting arrangement 600 having wire bonds from the LEDs to joints formed at the intersections of cross wires and power wires. The lighting arrangement includes a substrate 602, such as that described above, along with LEDs 604, 606, and 608 and power wires 610 and 612 that are attached to the substrate. The LEDs may be bare dice or packaged dice. Additional control wires (not shown) may be attached to the substrate and connected to the LEDs in a manner similar to the manner in which the power wires are connected to the LEDs. The type of wire used for the power wires 610 and 612 may be the same as the type of wire used for the antenna wire 114 of FIG. 1. Also, the power wires and LEDs may be attached to the substrate using an adhesive layer as described above for the RF transponder arrangement.

LEDs 604, 606, and 608 are connected to the power wires 610 and 612 by respective pairs of bond wires at joints formed at the intersections of cross wires 618 and 620 and the power wires. For example, bond wires 614 and 616 connect LED 604 to the power wires 610 and 612, respectively, at the joints 622 and 624. The connections are similar to the connections described above for the RF transponder arrangement 100 and connections illustrated in FIGS. 2, 3, and 4. Though not shown, it will be recognized that current regulating circuits, such as resistors, may be connected between the power wiring and the LEDs.

The wiring pattern of FIG. 6 illustrates an alternative positional relationship between a cross wire and the wire segment with which a connection joint is formed. Though it may be preferable for the cross wire and wire to intersect at a right angle in order to provide a small and stable target for compression of the wires at the intersection, as is illustrated in FIGS. 1, 2, and 3, in some applications forming intersections at right angles may not be feasible. As shown in FIG. 6, the cross wires and wire segments may intersect at an angle other than a right angle. However, if the difference between the supplementary angles at the intersection of a cross wire and a wire segment are too great, accurate identification of the target area for compressing the wires and making a stable joint may be difficult.

Figure 7:
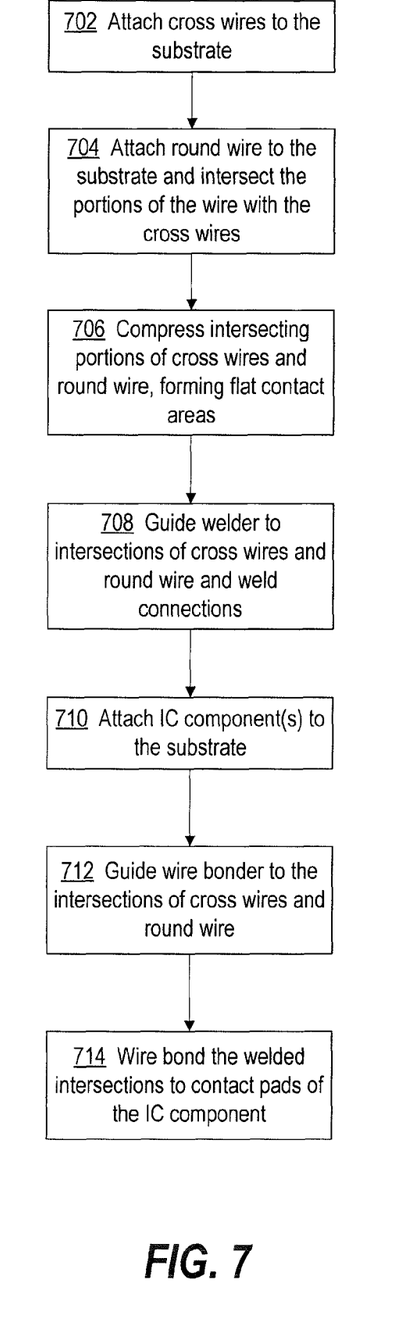
FIG. 7 is a flowchart of a process of making a circuit arrangement having an electronic device wire bonded to joints formed at the intersections of cross wires and other round wire segments.

FIG. 7 is a flowchart of a process of making a circuit arrangement having an electronic device wire bonded to joints formed at the intersections of cross wires and other round wire segments. Cross wires are attached to the substrate at block 702. The cross wires may be attached with a pressure-sensitive adhesive and located near the position on the substrate that is or will be occupied by the electronic device. The substrate, adhesive, and cross wires may be as described above.

At block 704, one or more round wire segments are attached to the substrate with the pressure-sensitive adhesive, with portions of the one or more wire segments intersecting the cross wires, respectively. The wire segments may implement a desired antenna pattern for an RF transponder or power and control wires for LEDs. The type of wire may be as described above in regards to the RF transponder arrangement 100 and the LED-based lighting arrangement 600.

At block 706, the intersecting portions of the one or more wire segments and the cross wires are compressed to interlock the intersecting portions and form flat contact areas at the intersections. In an example approach, the joints may be compressed by robotic action. A robot may have an image sensor and processor for identifying intersections. Based on the imagery, a head unit may be positioned above a joint to be compressed. The head unit may include a pneumatically actuated piston having a cross section that is approximately the size of the joint to be compressed. Once in position and at the desired height, the piston is driven by pneumatic force in a hammer action at the joint. The striking of the piston against the joint interlocks the portions of the wires at the intersection and forms a flat contact area for wire bonding.

At block 708, the compressed joints are welded. In one approach, the joints may be welded using an ultrasonic welder that is guided to the joints by digital imagery and robotic control.

At block 710, one or more electronic devices are attached to the substrate with the pressure-sensitive adhesive and placed near the cross wires. The electronic devices may be attached before or after the cross wires and wire segments are attached to the substrate, depending on implementation requirements. The electronic device may be either an RF transponder or an LED, and the substrate may be rigid or flexible, all as described above.

The wire bonding head of a wire bonder is guided to the flat contact areas at block 712. The wire bonder may be imagery-based, using images of the wiring to position the wire bonding head at the intersections of the cross wires and wire segments on the substrate. At block 714, the joints formed at the intersections of the cross wires and wire segments are wire bonded to contact pads on the electronic device. The bond wires may be wedge bonded or ball bonded, depending on application requirements. In implementations in which insulated wire is used, the welding and wedge bonding at the intersections of the cross wires and wire segments effectively removes the dielectric material at the joints. Though blocks 702-714 are presented in a particular order, it will be recognized that the order of processing may vary according to implementation requirements.

Although FIGS. 1 and 6 illustrate circuit arrangements that include an RF transponder and LEDs, it will be recognized that the disclosed approaches for wire bonding to round wire are similarly applicable to other electronic devices, such as other integrated circuit (IC) components or discrete components such as capacitors, resistors, etc.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A circuit arrangement, comprising:
a substrate;
an electronic device attached to the substrate;
first and second cross wires attached to the substrate and disposed proximate the electronic device;
one or more wire segments attached to the substrate and having first and second portions attached at a third portion of the first cross wire and at a fourth portion of the second cross wire, respectively;
wherein the first and second cross wires and the one or more wire segments are round wires having round cross sections, the first portion and the third portion have flat areas of contact, and the second and fourth portions have flat areas of contact;
a first bond wire connected to the electronic device and to the first portion of the one or more wire segments; and
a second bond wire connected to the electronic device and to the second portion of the one or more wire segments.

2. The circuit arrangement of claim 1, wherein the first bond wire is attached at the first portion of the one or more wire segments, and the second bond wire is attached at the second portion of the one or more wire segments.

3. The circuit arrangement of claim 1, wherein the first and second cross wires are larger gauge than the one or more wire segments, and the one or more wire segments are a larger gauge than the first and second bond wires.

4. The circuit arrangement of claim 1, wherein the one or more wire segments is one wire segment, and the first and second portions are end portions of the one round wire segment.

5. The circuit arrangement of claim 1, wherein the one or more wire segments include first and second wire segments, and the first portion is between end portions of the first wire segment, and the second portion is between end portions of the second wire segment.

6. The circuit arrangement of claim 1, wherein the first and second cross wires are one of copper, silver-coated copper, aluminum, or stainless steel.

7. The circuit arrangement of claim 1, further comprising a layer of pressure sensitive adhesive that bonds the electronic device, the first and second cross wires, and the one or more wire segments to the substrate.

8. The circuit arrangement of claim 1, wherein the electronic device is an RF transponder, and the one or more wire segments form an antenna.

9. The circuit arrangement of claim 1, wherein the electronic device is an LED and the one or more wire segments include power wiring.

10. The circuit arrangement of claim 1, wherein the substrate is a flexible substrate.

11. The circuit arrangement of claim 10, wherein the flexible substrate is one of a polyethylene terephthalate (PET), a polyelectrolyte multilayers (PEMs), paper, a high-density polyethylene, or a vinyl.

12. A method of making a circuit arrangement, comprising:
attaching first and second cross wires to a substrate, the first and second cross wires having round cross sections;
attaching one or more wire segments to the substrate, the one or more wire segments having a round cross section and first and second portions that intersect the first and second cross wires, respectively;
compressing the first and second portions of the one or more wire segments and portions of the cross wires at intersections with the first and second portions of the one or more wire segments;
attaching an electronic device to the substrate proximate the first and second cross wires; and
wire bonding compressed portions of the first and second portions of the one or more wire segments and portions of the cross wires to the electronic device.

13. The method of claim 12, wherein the wire bonding includes attaching a first bond wire at the first portion of the one or more wire segments, and attaching a second bond wire at the second portion of the one or more wire segments.

14. The method of claim 13, wherein the first and second cross wires are larger gauge than the one or more wire segments, and the one or more wire segments are a larger gauge than the first and second bond wires.

15. The method of claim 12, wherein the one or more wire segments is one wire segment, and the first and second portions are end portions of the one round wire segment.

16. The method of claim 12, wherein the one or more wire segments includes first and second wire segments, and the first portion is between end portions of the first wire segment, and the second portion is between end portions of the second wire segment.

17. The method of claim 12, wherein the first and second cross wires are one of copper, silver-coated copper, aluminum, or stainless steel.

18. The method of claim 12, wherein:
the attaching of the first and second cross wires to the substrate includes attaching the first and second cross wires to the substrate using an adhesive;
the attaching of the electronic device to the substrate includes attaching the electronic device to the substrate using the adhesive; and
the attaching of the one or more wire segments to the substrate includes attaching the one or more round wire segments to the substrate using the adhesive.

19. The method of claim 18, wherein the adhesive is a pressure sensitive adhesive.

20. The method of claim 12, wherein the electronic device is an RF transponder, and the one or more wire segments form an antenna.

21. The method of claim 12, wherein the electronic device is an LED and the one or more wire segments include power wiring.

22. The method of claim 12, wherein the substrate is a flexible substrate.

23. The method of claim 22, wherein the flexible substrate is one of a polyethylene terephthalate (PET), a polyelectrolyte multilayers (PEMs), paper, a high-density polyethylene, or a vinyl.

* * * * *